(12) United States Patent
Takayama et al.

(10) Patent No.: US 7,375,006 B2
(45) Date of Patent: May 20, 2008

(54) PEELING METHOD

(75) Inventors: Toru Takayama, Atsugi (JP); Junya Maruyama, Ebina (JP); Yuugo Goto, Atsugi (JP); Yumiko Ohno, Atsugi (JP); Takuya Tsurume, Atsugi (JP); Hideaki Kuwabara, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/542,216

(22) Filed: Oct. 4, 2006

(65) Prior Publication Data

US 2007/0032042 A1    Feb. 8, 2007

Related U.S. Application Data

(62) Division of application No. 10/619,074, filed on Jul. 15, 2003, now Pat. No. 7,122,445.

(30) Foreign Application Priority Data

Jul. 16, 2002  (JP)  ............... 2002-207540

(51) Int. Cl.
    *H01L 21/30*    (2006.01)
(52) U.S. Cl. ............... 438/458; 257/E21.567; 257/E21.568
(58) Field of Classification Search ........ 438/455–459; 257/E21.122, E21.567, E21.568
    See application file for complete search history.

(56) References Cited

U.S. PATENT DOCUMENTS 5,405,802 A * 4/1995 Yamagata et al. .......... 438/459

(Continued)

FOREIGN PATENT DOCUMENTS

EP    0 858 110    8/1998

(Continued)

OTHER PUBLICATIONS

European Patent Office, Search Report dated Jul. 21, 2005 for Application No. 03015816.6.

(Continued)

*Primary Examiner*—Brook Kebede
(74) *Attorney, Agent, or Firm*—Eric J. Robinson; Robinson Intellectual Property Law Office, P.C.

(57) ABSTRACT

A peeling method is provided which does not cause damage to a layer to be peeled, and the method enables not only peeling of the layer to be peeled having a small area but also peeling of the entire layer to be peeled having a large area at a high yield. Further, there are provided a semiconductor device, which is reduced in weight through adhesion of the layer to be peeled to various base materials, and a manufacturing method thereof. In particular, there are provided a semiconductor device, which is reduced in weight through adhesion of various elements, typically a TFT, to a flexible film, and a manufacturing method thereof. A metal layer or nitride layer is provided on a substrate; an oxide layer is provided contacting with the metal layer or nitride layer; then, a base insulating film and a layer to be peeled containing hydrogen are formed; and heat treatment for diffusing hydrogen is performed thereto at 410° C. or more. As a result, complete peeling can be attained in the oxide layer or at an interface thereof by using physical means.

27 Claims, 11 Drawing Sheets

U.S. PATENT DOCUMENTS

| | | | |
|---|---|---|---|
| 5,453,394 A * | 9/1995 | Yonehara et al. | 438/455 |
| 5,815,223 A | 9/1998 | Watanabe et al. | |
| 5,834,327 A | 11/1998 | Yamazaki et al. | |
| 5,990,542 A | 11/1999 | Yamazaki | |
| 6,127,199 A | 10/2000 | Inoue et al. | |
| 6,153,495 A | 11/2000 | Kub et al. | |
| 6,271,101 B1 | 8/2001 | Fukunaga | |
| 6,290,804 B1 | 9/2001 | Henley et al. | |
| 6,309,950 B1 | 10/2001 | Forbes | |
| 6,319,757 B1 | 11/2001 | Parsons et al. | |
| 6,333,215 B1 | 12/2001 | Matsuda et al. | |
| 6,372,608 B1 * | 4/2002 | Shimoda et al. | 438/455 |
| 6,410,436 B2 | 6/2002 | Yamagata et al. | |
| 6,420,283 B1 | 7/2002 | Ogawa et al. | |
| 6,423,614 B1 | 7/2002 | Doyle | |
| 6,441,468 B1 | 8/2002 | Yamazaki | |
| 6,445,059 B1 | 9/2002 | Yamazaki | |
| 6,527,964 B1 | 3/2003 | Smith et al. | |
| 6,534,382 B1 | 3/2003 | Sakaguchi et al. | |
| 6,569,595 B1 | 5/2003 | Sato et al. | |
| 6,593,213 B2 | 7/2003 | Stanbery | |
| 6,602,761 B2 | 8/2003 | Fukunaga | |
| 6,624,046 B1 | 9/2003 | Zavracky et al. | |
| 6,653,209 B1 | 11/2003 | Yamagata | |
| 6,682,963 B2 | 1/2004 | Ishikawa | |
| RE38,466 E | 3/2004 | Inoue et al. | |
| 6,744,116 B1 | 6/2004 | Doyle | |
| 6,756,286 B1 | 6/2004 | Aspar et al. | |
| 6,811,945 B2 | 11/2004 | Kobayashi | |
| 6,828,214 B2 | 12/2004 | Notsu et al. | |
| 6,852,653 B2 | 2/2005 | Yamazaki et al. | |
| 2001/0015256 A1 | 8/2001 | Yamazaki et al. | |
| 2002/0146893 A1 | 10/2002 | Shimoda et al. | |
| 2002/0175345 A1 | 11/2002 | Yamazaki | |
| 2003/0032210 A1 | 2/2003 | Takayama et al. | |
| 2003/0064569 A1 | 4/2003 | Takayama et al. | |
| 2003/0217805 A1 | 11/2003 | Takayama et al. | |
| 2003/0224582 A1 | 12/2003 | Shimoda et al. | |
| 2004/0087110 A1 | 5/2004 | Takayama et al. | |
| 2004/0129960 A1 | 7/2004 | Maruyama et al. | |
| 2004/0132265 A1 | 7/2004 | Maruyama et al. | |
| 2004/0140547 A1 | 7/2004 | Yamazaki et al. | |
| 2004/0169786 A1 | 9/2004 | Yamazaki et al. | |
| 2004/0219762 A1 | 11/2004 | Shimoda et al. | |
| 2004/0232413 A1 | 11/2004 | Yamazaki et al. | |
| 2004/0256618 A1 | 12/2004 | Imai et al. | |
| 2004/0263712 A1 | 12/2004 | Yamazaki et al. | |
| 2005/0023526 A1 | 2/2005 | Yamazaki | |
| 2005/0052584 A1 | 3/2005 | Yamazaki et al. | |

FOREIGN PATENT DOCUMENTS

| | | |
|---|---|---|
| EP | 1 363 319 | 11/2003 |
| JP | 10-064821 | 3/1998 |
| JP | 10-125929 | 5/1998 |
| JP | 10-125930 | 5/1998 |
| JP | 10-125931 | 5/1998 |
| JP | 11-135882 | 5/1999 |
| JP | 2001-189460 | 7/2001 |

OTHER PUBLICATIONS

A.J. Auberton-Herve et al., *Industrial Research Society*, (Kogyo Chosa Kai); Electronic Material, Aug. 1997, pp. 83-87.

Nikkei Microdevices, *Realization of a Display that is Thin, Light and Unbreakable*, Issued Jul. 1, 2002, pp. 71-72.

* cited by examiner

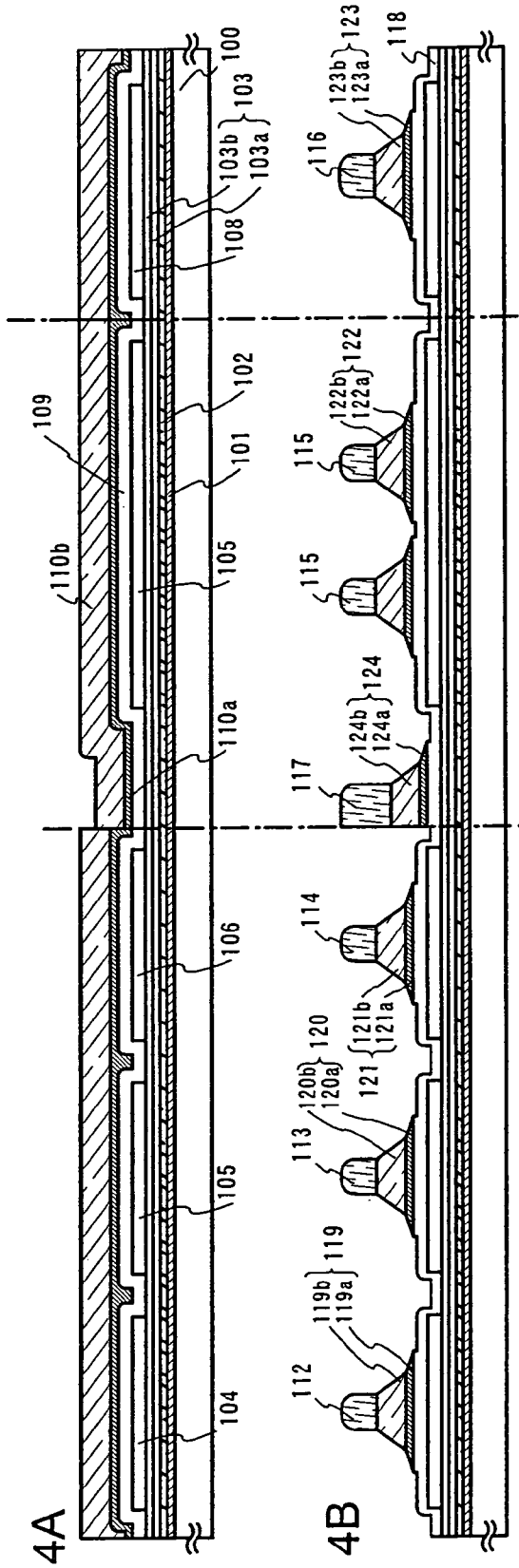

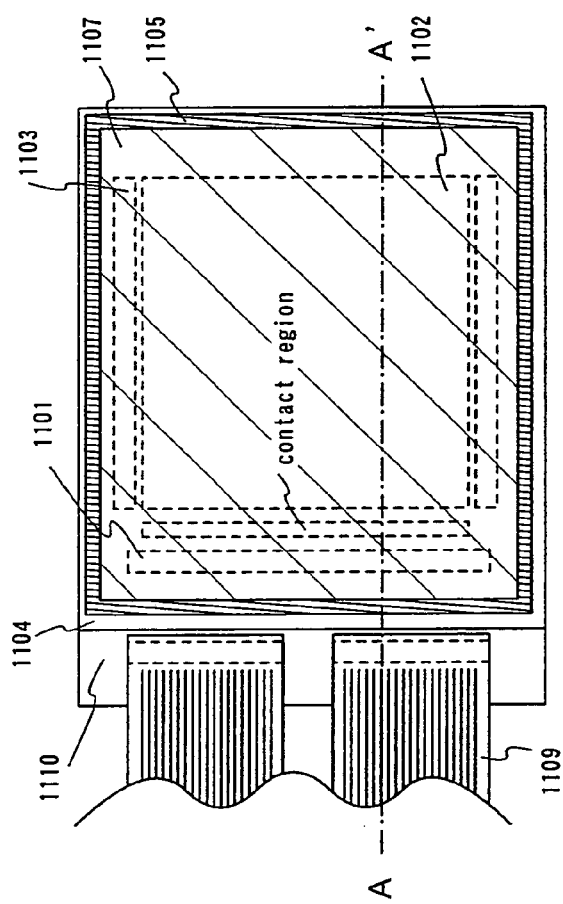
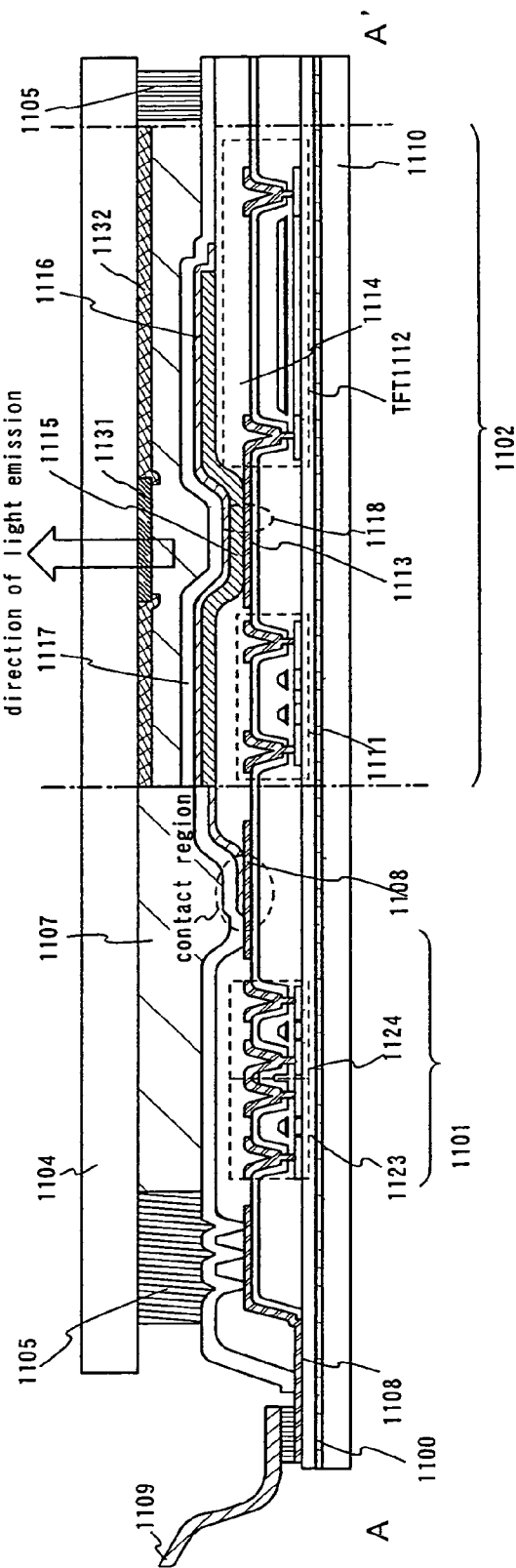
Fig. 8A
Fig. 8B

PEELING METHOD

BACKGROUND OF THE INVENTION

1. Field of the Invention

The present invention relates to a peeling method of a layer to be peeled, especially a peeling method of a layer to be peeled containing various elements. In addition to that, the present invention relates to a semiconductor device comprising a circuit composed of a thin film transistor (hereinafter referred to as TFT) transferred by sticking a separated layer to be peeled to a substrate and its manufacturing method. The invention relates, for example, an electrooptical device such as a liquid crystal module, a light emitting device such as an EL module, and an electronic apparatus containing such devices as components therein.

The term semiconductor device, in this specification, covers any device as a whole capable of functioning by utilizing semiconductor characteristics and an electro optical device, a light emitting device, a semiconductor circuit, and electronic apparatuses are all included in the semiconductor device.

2. Description of the Related Art

Recently, attention has been paid to technology of composing a thin film transistor (TFT) using a semiconductor thin film (the thickness of about several to several hundred nm) formed on a substrate having an insulating surface. The thin film transistor is widely applied to electronic devices such as IC and an electrooptical device. Especially, its development as a switching element for an image display apparatus has been urged.

Among a variety of expected applications of such an image display apparatus, above all, utilization for mobile devices draws attention. Today, although a glass substrate, a quartz substrate and the like are used in many cases, they have disadvantages that they are easy to crack and heavy. Further, in terms of mass production, the glass substrate, the quartz substrate and the like are difficult and unsuitable for enlargement. Therefore, a substrate having flexibility, such as a flexible plastic film has been tried to form a TFT element thereon.

However, since the heat resistance of the plastic film is low, the highest temperature for process is required to be low and consequently, it is presently impossible to form any TFT with electric characteristics as excellent as those formed on a glass substrate. Hence, no liquid crystal display apparatus and light emitting element using a plastic film has been actualized.

Further, a peeling method for peeling from the said substrate a layer to be peeled existing on a substrate through an isolation layer, has been already proposed. For example, a technique described in Japanese Unexamined Patent Publication No. 10-125929 and Japanese Unexamined Patent Publication No. 10-125931 is a method for separating a substrate by forming an isolation layer of amorphous silicon (or polycrystalline silicon) and releasing hydrogen contained in the amorphous silicon by radiating laser beam through a substrate to form voids for substrate separation. In addition to that, in Japanese Unexamined Patent Publication No. 10-125930, there is a description that using this technique, a liquid crystal display apparatus is completed by sticking a layer to be peeled (in the specification, called as a transferred layer) to a plastic layer.

However, by the above-described method, it is essential to use a substrate with high translucency. In order to transmit energy through the substrate and supply energy sufficient to release hydrogen contained in the amorphous silicon, relatively intense laser beam has to be radiated, resulting in a problem that the layer to be peeled is damaged. Further, by the above-described method, in the case an element is formed on an isolation layer, if heat treatment at a high temperature is carried out in the element fabrication process, hydrogen contained in the isolation layer is diffused and decreased. As a result, there is a possibility of insufficient peeling, even if laser beam is radiated to the isolation layer. Subsequently, attributed to retention of the quantity of hydrogen contained in the isolation layer, there occurs a problem that the process after isolation layer formation may be limited. Also, in the above-described specification, there is a description that in order to prevent damages in the layer to be peeled, a light shielding layer or reflecting layer is formed. In such a case, it becomes difficult to fabricate a transmission type liquid crystal display device. Additionally, by the above-described method, peeling of the layer to be peeled having a large surface area becomes difficult.

SUMMARY OF THE INVENTION

The invention has been completed in consideration of the above-described problems and the invention aims to provide a peeling method without damaging a layer to be peeled and to allow separation of not only a layer to be peeled having a small surface area but also the entire surface of a layer to be peeled having a large surface area.

Further, the invention aims to provide a peeling method in which the temperature for heat treatment, the type or the like of a substrate is not limited in formation of a layer to be peeled.

Further, the invention aims to provide a lightweight semiconductor device by sticking a layer to be peeled to a variety of substrates and its fabrication method. Especially, the invention aims to provide a lightweight semiconductor device by sticking a variety of elements such as a TFT [a thin film diode, a photoelectric conversion element comprising PIN junction of silicon, and silicon resistor element] to a flexible film and its fabrication method.

Through a large number of experiments and examinations, the inventors of the present invention have found a peeling method in which, when: a metal layer is provided on a substrate; an oxide layer is formed contacting with the metal layer; an insulating film is formed on the oxide layer; a layer containing hydrogen, typically an amorphous silicon film containing hydrogen, is formed on the insulating film; and heat treatment is performed to the resultant lamination layer at 410° C. or more, while abnormality in the process such as peeling does not occur, peeling can be completely performed with ease at an interface of the oxide layer (interface of the oxide layer and the metal layer) by using physical means, typically performing application of a mechanical force (for example, performing peeling with hand).

That is, while a bonding force between the metal layer and the oxide layer can withstand heat energy, the bonding force between the metal layer and the oxide layer becomes weak at dynamical energy according to diffusion and reaction of hydrogen between the metal layer and the oxide layer, and then, changing a film stress of the metal film, the oxide film or the amorphous silicon film. Thus, peeling becomes easy to occur through the application of the mechanical force. Note that the present invention is not limited to the amorphous silicon film, and a semiconductor film capable of being formed by PCVD, for example, a germanium film, an alloy film of silicon and germanium, or an amorphous silicon film containing phosphor or boron may be used.

Further, when the oxide layer is formed on the metal layer, a surface of the metal layer is oxidized. Thus, adhesion property between the metal layer and the oxide layer is improved. Then, it is considered that hydrogen contained in the layer containing hydrogen is diffused at 410° C. or more, and the reaction (for example, reduction reaction) of hydrogen and the oxidized surface of the metal layer occurs, whereby the adhesion property between the metal layer and the oxide layer is lowered. In addition, since the stress of the layer containing hydrogen is changed toward a tensile stress through heating, distortion is caused at the interface of the metal layer and the oxide layer, which easily leads to peeling.

Note that, in this specification, an internal stress of a film (called film stress) indicates a force per unit sectional area which one of sections imparts to the other section in terms of the arbitrary section in the film formed on the substrate. It can be said that, to a greater or less extent, the internal stress always exists in a thin film formed by vacuum evaporation, sputtering, vapor phase growth, or the like. The value reaches $10^9$ N/m$^2$ at the maximum. The internal stress value is changed depending on a material for the thin film, a substance for the substrate, a forming condition of the thin film, and the like. Further, the internal stress value is also changed through heat treatment.

Moreover, a state in which a force exerted on an opponent through a unit sectional area perpendicular to a substrate surface is in a direction of pull is referred to as a tensile state, and the internal stress in the state is referred to as a tensile stress. A state in which the force is in a direction of push is referred to as a compression state, and the internal stress in the state is referred to as a compression stress.

According to the present invention, Structure 1 of a peeling method disclosed in this specification relates to a peeling method in which a layer to be peeled is peeled from a substrate, including:

sequentially forming, on the substrate, a metal layer, an oxide layer contacting with the metal layer, an insulating film, and a semiconductor with an amorphous structure on the insulating film to form a lamination layer;

performing heat treatment for diffusing hydrogen; and adhering a support member to the layer to be peeled that includes the oxide layer, the insulating film and the semiconductor film and then peeling the layer to be peeled, which is adhered to the support member, from the substrate provided with the metal layer by means of physical means.

Further, according to the present invention, Structure 2 of another peeling method disclosed in this specification relates to a peeling method in which a layer to be peeled is peeled from a substrate, including:

sequentially forming, on the substrate, a metal layer, an oxide layer contacting with the metal layer, an insulating film, and a semiconductor with an amorphous structure on the insulating film to form a lamination layer;

performing heat treatment for diffusing hydrogen;

forming a TFT including the semiconductor film as an active layer and an element connected with the TFT; and adhering a support member to the layer to be peeled that includes the oxide layer, the insulating film, the TFT, and the element and then peeling the layer to be peeled, which is adhered to the support member, from the substrate provided with the metal layer by means of physical means.

In the above structure, there is no particular limitation placed on the order of a step of performing heat treatment for diffusing hydrogen and a step of forming a TFT including the semiconductor film as an active layer and an element connected with the TFT. Further, in the case of performing heat treatment at 410° C. or more in the step of forming the TFT including the semiconductor film as the active layer and the element connected with the TFT, the heat treatment for diffusing hydrogen does not need to be performed separately.

In each of the above-mentioned structures, the method is characterized in that the heat treatment is performed at a temperature equal to or higher than a temperature at which hydrogen in a film is emitted or diffused, that is, 410° C. or more.

Furthermore, in each of the above-mentioned structures, the method is characterized in that the metal layer is a single layer comprised of an element selected from the group consisting of W, Ti, Ta, Mo, Cr, Nd, Fe, Ni, Co, Zr, Zn, Ru, Rh, Pd, Os, Ir, and Pt or an alloy material or compound material that contains the element as its main constituent, or is a lamination layer comprised of the metals or mixtures thereof.

Note that, in this specification, the physical means indicates means that is categorized into not chemistry but physics. Specifically speaking, the physical means is dynamical or mechanical means having the process based on the rule of dynamics, and indicates means for changing some dynamical energy (mechanical energy).

Note that, in any of the above-described structures, it is necessary that a bonding force between the oxide layer and the metal layer is set smaller than a bonding force with a support member when peeling is performed by the physical means.

Further, a metal layer containing hydrogen may be used in place of a semiconductor layer containing hydrogen. Structure 3 of the present invention concerning another peeling method relates to a peeling method in which a layer to be peeled is peeled from a substrate, including:

sequentially forming, on the substrate, a metal layer, an oxide layer contacting with the metal layer, an insulating film, and a metal layer containing hydrogen on the insulating film to form a lamination layer;

performing heat treatment for diffusing hydrogen;

forming a TFT including the semiconductor film as an active layer and an element connected with the TFT; and adhering a support member to the layer to be peeled that includes the oxide layer, the insulating film, the TFT, and the element and then peeling the layer to be peeled, which is adhered to the support member, from the substrate provided with the metal layer by means of physical means.

Further, a metal layer containing hydrogen may be used as a metal layer, and Structure 4 of the present invention concerning another peeling method relates to a peeling method in which a layer to be peeled is peeled from a substrate, including:

sequentially forming, on the substrate, a metal layer containing hydrogen, an oxide layer contacting with the metal layer, an insulating film, and a semiconductor with an amorphous structure on the insulating film to form a lamination layer;

performing heat treatment for diffusing hydrogen;

forming a TFT including the semiconductor film as an active layer and an element connected with the TFT; and adhering a support member to the layer to be peeled that includes the oxide layer, the insulating film, the TFT, and the element and then peeling the layer to be peeled, which is adhered to the support member, from the substrate provided with the metal layer by means of physical means.

Further, in each of the above-mentioned structures, the method is characterized in that the oxide layer is a silicon oxide film formed by sputtering.

Further, in each of the above-mentioned structures, the method is characterized in that the insulating film is a silicon oxide film, a silicon oxynitride film, or a lamination layer of the films.

Further, in each of the above-mentioned structures, the method is characterized in that a thickness of the oxide layer is thicker than a film thickness of the metal layer.

Further, in each of the above-mentioned structures, the method is characterized in that an element provided on the insulating film is a light emitting element, a semiconductor element, or a liquid crystal element.

Further, a W film or Ni film, which is formed by using CVD (remote plasma or the like), may be used as the metal layer containing hydrogen. For example, silicon that serves as a nucleus of the W film is extracted with an $SiH_4$ gas, or a surface of a silicon oxide film (or silicon nitride film) is exposed to rare gas plasma to cut an Si—O bond (or Si—N bond) to extract silicon. Then, a $WF_6/H_2$ gas is flown to cause a reduction reaction, thereby being capable of depositing the W film. The method of depositing the W film with the reduction reaction is one kind of CVD which is also referred to as a blanket W method. Further, as the metal layer containing hydrogen, an $AB_2$ type hydrogen occluded alloy containing hydrogen (incidentally, Ti or Zr as A, Ni, V, Cr, Co, Fe, or Mn as B) or an $AB_5$ type hydrogen occluded alloy containing hydrogen (incidentally, Mm (mish metal) as A, Ni, Co, Mn, Al, or Mo as B) may be used.

Further, in each of the above-described structures, as to the metal layer, another layer, for example, an insulating layer may be provided between the substrate and the metal layer. However, it is preferable that the metal layer is formed so as to be in contact with the substrate for simplification of the process.

Moreover, according to the present invention, not only the substrate having translucency but also any substrate, for example, a glass substrate, quartz substrate, semiconductor substrate, ceramic substrate, and metal substrate may be used. The layer to be peeled provided on the substrate can be peeled.

Note that, in this specification, the transfer member is a member to be adhered to the layer to be peeled after peeling, and there is no particular limitation placed on the transfer member. The transfer member may be comprised of any base material such as plastic, glass, metal, or ceramics. Further, in this specification, the support member is a member to be adhered to the layer to be peeled in peeling with the physical means, and there is no particular limitation placed on the support member. The support member may be comprised of any base material such as plastic, glass, metal, or ceramics. In addition, both the shape of the transfer member and the shape of the support member are not particularly limited, and a shape having a plane, one having a curved surface, one with flexibility, or film shape may be adopted. Further, when reduction in weight is placed at the highest priority, preferably used is a film-like plastic substrate, for example, a plastic substrate comprised of poly (ethylene terephthalate) (PET), polyether sulfone (PES), poly(ethylene naphthalate) (PEN), polycarbonate (PC), nylon, poly(etheretherketone) (PEEK), polysulfone (PSF), polyetherimide (PEI), polyarylate (PAR), poly(butylene telephthalate) (PBT), or polyimide.

In each of the above-described structures related to the method of manufacturing a semiconductor device, it is sufficient that: the support member is used as an opposing substrate; and the support member is adhered to the layer to be peeled with the use of a sealing material as an adhesive for the case of manufacturing a liquid crystal display device.

In this case, an element provided in the layer to be peeled includes a pixel electrode, and a liquid crystal material is filled between the pixel electrode and the opposing substrate.

Further, in each of the above-described structures related to the method of manufacturing a semiconductor device, in the case of the manufacture of a light emitting device typified as a light emitting device including an EL element, it is preferable that: the support member is used as a sealing member; and a light emitting element is completely shut off from the outside to avoid the entry of a substance which promotes deterioration of an organic compound layer, such as moisture or oxygen from the outside. Further, when reduction in weight is placed at the highest priority, a film-like plastic substrate is preferably used. However, this exerts a little effect of avoiding the entry of the substance, which promotes deterioration of the organic compound layer, such as moisture or oxygen from the outside. Therefore, there may be adopted, for example, a structure in which a first insulating film, a second insulating film, and a third insulating film are provided on the support member, thereby sufficiently avoiding the entry of the substance which promotes deterioration of the organic compound layer, such as moisture or oxygen from the outside. Note that the second insulating film (stress relaxing film) sandwiched between the first insulating film (barrier film) and the third insulating film (barrier film) is made to have a film stress smaller than that of either the first insulating film or the third insulating film.

Moreover, in the case of the manufacture of a light emitting device typified as a light emitting device including an EL element, it is preferable that a first insulating film, a second insulating film, and a third insulating film are provided to not only the support member but also the transfer member, which sufficiently avoids the entry of the substance which promotes deterioration of the organic compound layer, such as moisture or oxygen from the outside.

BRIEF DESCRIPTION OF THE DRAWINGS

In the accompanying drawings:

FIGS. 4A to 4D are views showing steps of manufacturing an active matrix substrate (Embodiment 1);

FIGS. 8A and 8B are a top view and a sectional view of a light emitting device, respectively (Embodiment 3);

DETAILED DESCRIPTION OF THE PREFERRED EMBODIMENTS

Hereinafter, an embodiment mode of the present invention will be described.

Figure 1A:
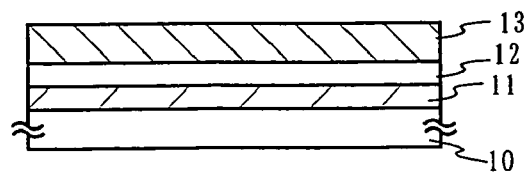
FIGS. 1A to 1G are views showing an embodiment mode.

In FIG. 1A, reference numeral 10 denotes a substrate; 11 denotes a nitride layer or metal layer; 12 denotes an oxide layer; and 13 denotes a layer to be peeled.

In FIG. 1A, the substrate 10 may be a glass substrate, quartz substrate, ceramic substrate, or the like. Besides, a silicon substrate, metal substrate, or stainless substrate may be used.

First, as shown in FIG. 1A, the nitride layer or metal layer 11 is formed on the substrate 10. It is sufficient that: the nitride layer or metal layer 11 is typically a single layer comprised of an element selected from the group consisting of W, Ti, Ta, Mo, Nd, Ni, Co, Zr, Zn, Ru, Rh, Pd, Os, Ir, and Pt or an alloy material or compound material that contains the element as its main constituent, or is a lamination layer of the above elements or materials; and alternatively, the nitride layer or metal layer 11 is a single layer comprised of a nitride of the element, for example, titanium nitride, tungsten nitride, tantalum nitride, or molybdenum nitride, or is a lamination layer of the nitrides. A thickness of the nitride layer or metal layer 11 is 10 nm to 200 nm, preferably 50 nm to 75 nm.

Further, a thickness in the vicinity of a peripheral portion of the substrate is likely to be ununiform since the substrate is fixed by sputtering. Therefore, it is preferable that only the peripheral portion is removed by conducting dry etching. At this time, an insulating film comprised of a silicon oxynitride film may be formed to have a thickness of approximately 100 nm between the substrate 10 and the nitride layer or metal layer 11 in order to prevent the substrate from being subjected to etching.

Next, the oxide layer 12 is formed on the nitride layer or metal layer 11. As the oxide layer 12, a layer comprised of silicon oxide, silicon oxynitride, or metal oxide may be formed by sputtering. Desirably, a thickness of the oxide layer 12 is equal or more than about twice the thickness of the nitride layer or metal layer 11. Here, a silicon oxide film is formed to have a thickness of 150 nm to 200 nm by sputtering with the use of a silicon oxide target. Note that, as a result of the measurement of a stress of the silicon oxide film obtained by sputtering, the stress is $-3.97 \times 10^8$ (Dyne/$cm^2$), and a hydrogen concentration thereof is $4 \times 10^{20}$ atoms/$cm^3$ through SIMS measurement. Note that the measurement values are relative to a single layer, and are not relative to a lamination layer.

Then, the layer to be peeled 13 is formed on the oxide layer 12. In the formation of the layer to be peeled 13, at least a material film containing hydrogen (semiconductor film or metal film) is formed, and then, heat treatment is performed for diffusing hydrogen contained in the material film containing hydrogen. The heat treatment is sufficiently performed at 410° C. or more, and may be performed separately from the process of forming the layer to be peeled 13 or omitted by making the process also serve as the heat treatment. For example, in the case where an amorphous silicon film containing hydrogen is used as the material film containing hydrogen, and is heated to form a polysilicon film, the heat treatment at 500° C. or more for crystallization can realize both the formation of the polysilicon film and the diffusion of hydrogen at one time. Note that the layer to be peeled 13 may be a layer comprised of one of various elements, which is typified by a TFT, (thin film diode, photoelectric conversion element comprised of a PIN junction of silicon, silicon resistance element, and sensor element (typically, pressure-sensitive fingerprint sensor that uses polysilicon)).

Figure 1B:
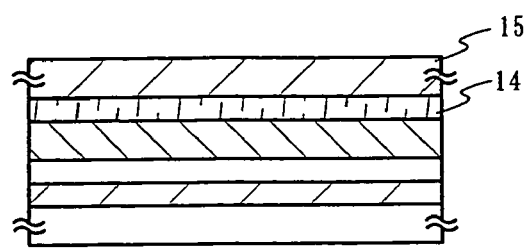

Subsequently, a second substrate 15, which serves as a support member for fixing the layer to be peeled 13, is adhered with a first adhesive 14. (FIG. 1B) Note that, it is preferable that the second substrate 15 employs a substrate having higher rigidity than that of the first substrate 10. An adhesive or double-faced tape may be used as the first adhesive 14.

Figure 1C:
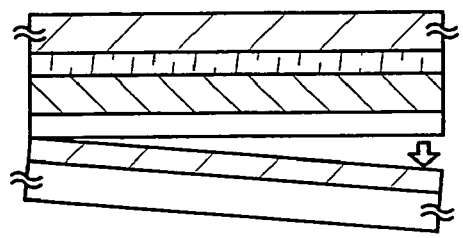

Then, the substrate 10 provided with the nitride layer or metal layer 11 is peeled by physical means. (FIG. 1C) Since the film stress of the oxide layer 12 differs from that of the nitride layer or metal layer 11, peeling can be performed with a relatively small force. Further, there is shown here an example in which it is assumed that a mechanical strength of the layer to be peeled 13 is sufficient. However, in the case where the mechanical strength of the layer to be peeled 13 is insufficient, it is preferable that peeling is performed after a support member (not shown) for fixing the layer to be peeled 13 is adhered.

Figure 1D:
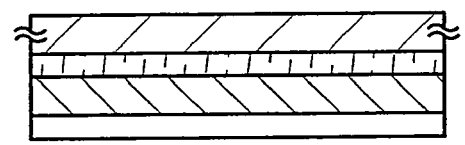

Thus, the layer to be peeled 13 formed on the oxide layer 12 can be separated from the substrate 10. The state obtained after peeling is shown in FIG. 1D.

Figure 1E:
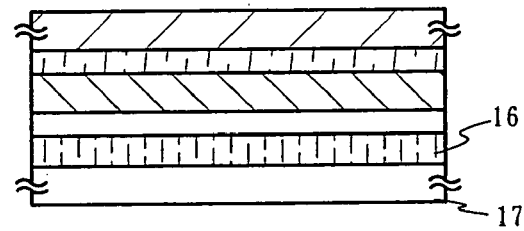

Thereafter, a third substrate, which serves as a transfer member, is adhered to the separated layer to be peeled 13 through a second adhesive 16. (FIG. 1E)

Figure 1F:
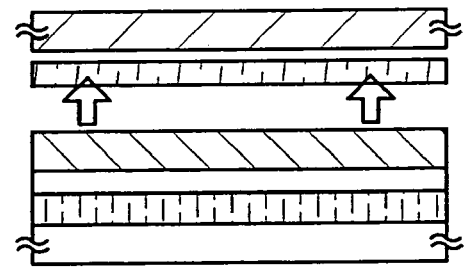

Subsequently, the second substrate 15 is peeled by removing or peeling the first adhesive 14. (FIG. 1F)

Figure 1G:
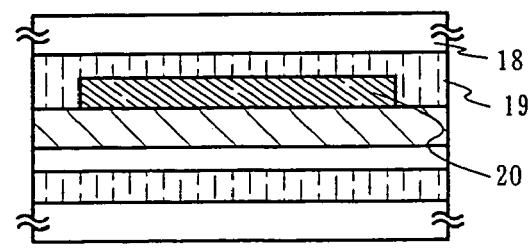

Then, an EL layer 20 is formed, and is sealed with a fourth substrate 18, which serves as a sealing member, through a third adhesive 19. (FIG. 1G) Note that the fourth substrate 18 is not particularly required as long as the third adhesive 19 is comprised of a material sufficiently capable of blocking a substance (moisture or oxygen) that promotes deterioration of an organic compound layer. Here, an example is shown in which a light emitting device that uses an EL element is manufactured, but the present invention is not particularly limited to the example. Various semiconductor devices can be completed according to the present invention.

In the case of manufacturing a liquid crystal display device, it may be that: an opposing substrate is used as a support member; and the support member is adhered to a layer to be peeled with the use of a sealing material as an adhesive. In this case, it is set that: an element provided in the layer to be peeled includes a pixel electrode; and a liquid crystal material is filled between the pixel electrode and the opposing electrode. Further, there is no particular limitation placed on the order of manufacturing the liquid crystal display device. It may be that: the opposing substrate as the support member is adhered; injection of liquid crystal is performed; then, a substrate is peeled; and a plastic substrate as a transfer member is adhered. Alternatively, it may be that: a pixel electrode is formed; a substrate is peeled; a plastic substrate as a first transfer member is adhered; and then, an opposing substrate as a second transfer member is adhered.

Also, the order of manufacturing a light emitting device is not particularly limited. It may be that: a light emitting element is formed; a plastic substrate as a support member is adhered; a substrate is peeled; and a plastic substrate as a transfer member is adhered. Alternatively, it may be that: a light emitting element is formed; a substrate is peeled; a plastic substrate as a first transfer member is adhered; and then, a plastic substrate as a second transfer member is adhered.

In the present invention, it is important that: the heat treatment performed at 410° C. or more causes diffusion of hydrogen at an interface of the nitride layer or metal layer 11 and the oxide layer 12 to develop a reaction; and further, the film stress of the oxide layer 12, the film stress of the nitride layer or metal layer 11, or all the stresses of the laminated layers on the substrate are changed. Note that the excessive change of the film stress may lead to generation of peeling, and therefore, it is preferable that the film formation and the other processes are performed with caution.

Further, the heat treatment at 500° C. or more or irradiation of laser light does not involve peeling therein. Then, the physical means can easily realize complete separation at the interface between the metal layer and the oxide layer.

As the result of the experiments performed by the inventors of the present invention, peeling with the peeling method according to the present invention has been recognized even with a tungsten film with a thickness of 10 nm, which serves as the metal layer 11, and a silicon oxide film, which is formed by sputtering and serves as the oxide layer 12, with a thickness of 200 nm. Also, peeling with the peeling method according to the present invention has been recognized even with a tungsten film with a thickness of 50 nm, which serves as the metal layer 11, and a silicon oxide film, which is formed by sputtering and serves as the oxide layer 12, with a thickness of 100 nm. Moreover, peeling with the peeling method according to the present invention has been recognized even with a tungsten film with a thickness of 50 nm, which serves as the metal layer 11, and a silicon oxide film, which is formed by sputtering and serves as the oxide layer 12, with a thickness of 400 nm.

Further, from the results of the experiments performed by the inventors of the present invention, peeling with the peeling method according to the present invention has been recognized even with a tungsten nitride film or titanium nitride film as the nitride layer 11.

Furthermore, the following experiments were performed.

Experiment 1

Figure 2:
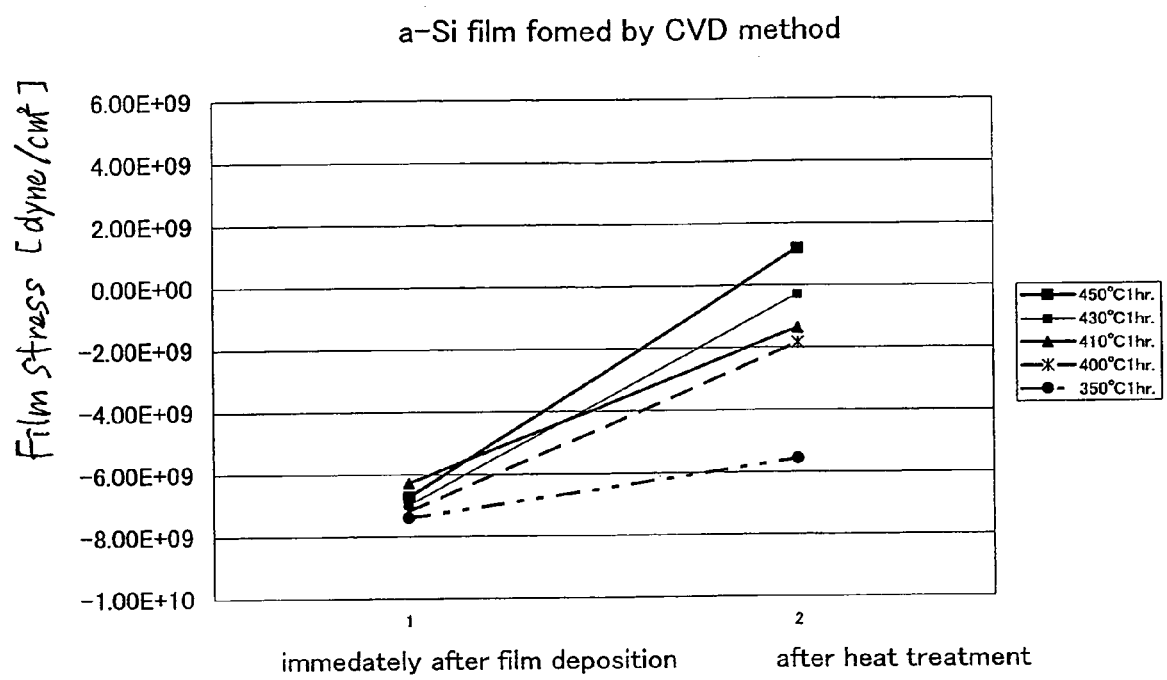
FIG. 2 is a graph showing a relationship between a heat treatment temperature and a stress in a single layer of an amorphous silicon film.

An amorphous silicon film containing hydrogen was formed on a glass substrate by PCVD (film deposition temperature of 300° C., film deposition gas $SiH_4$), then, heat treatments were performed under various conditions, and the respective stresses were measured. The obtained results are shown in FIG. 2. The respective heat treatment conditions are: 350° C. for one hour; 400° C. for one hour; 410° C. for one hour; 430° C. for one hour; and 450° C. for one hour.

It is seen from FIG. 2 that the stress value obtained through the heat treatment is changed more toward a tensile stress compared with the stress value obtained immediately after the film deposition ($-8 \times 10^9$ (Dyne/$cm^2$) to $-6 \times 10^9$ (Dyne/$cm^2$)) under any condition. The stress value obtained after the heat treatment falls in a range of $-6 \times 10^9$ (Dyne/$cm^2$) to $2 \times 10^9$ (Dyne/$cm^2$).

Further, a tungsten film, a silicon oxide film formed by sputtering, a base insulating film, and an amorphous silicon film containing hydrogen formed by PCVD were sequentially laminated on a glass substrate. The respective heat treatments under the above conditions were performed to the resultant lamination layer. Then, a peeling experiment was performed thereto using a tape. As a result, peeling was recognized at the heat treatment at 410° C. or more.

Experiment 2

As to the amorphous silicon film containing hydrogen obtained by PCVD under the same condition as in Experiment 1, a hydrogen concentration thereof was measured through FT-IR. As a result, Si—H was $1.06 \times 10^{22}$ (atoms/$cm^3$), Si—$H_2$ was $8.34 \times 10^{19}$ (atoms/$cm^3$), and the calculated hydrogen concentration in the composition ratio was 21.5%. Further, the hydrogen concentration was similarly calculated under the changed film deposition conditions with PCVD, as a result of which the obtained hydrogen concentrations in the composition ratio were 16.4%, 17.1%, and 19.0%.

Further, a tungsten film, a silicon oxide film formed by sputtering, a base insulating film, and an amorphous silicon film containing hydrogen formed by PCVD (film with a hydrogen concentration in the composition ratio is 16.4% to 21.5%) were sequentially laminated on a glass substrate. The heat treatment at 410° C. for one hour was performed to each of the resultant lamination layers. Then, a peeling experiment was performed thereto using a tape. As a result, peeling was recognized under all the conditions. On the contrary, peeling was not recognized in the peeling experiment with the use of the tape with regard to the amorphous silicon film obtained by sputtering instead of PCVD.

Moreover, a tungsten film, a silicon oxide film formed by sputtering, a base insulating film, and a silicon nitride film containing hydrogen formed by PCVD (film with a stress value of $-2.4 \times 10^8$ (Dyne/$cm^2$), Si—H of $8.9 \times 10^{21}$ (atoms/$cm^3$), and N—H of $6.6 \times 10^{21}$ (atoms/$cm^3$)) were sequentially laminated on a glass substrate. The heat treatment at 410° C. for one hour was performed to the resultant lamination layer. Then, the peeling experiment was performed thereto using the tape. As a result, peeling was recognized. From the above, the present invention is not particularly limited to the amorphous silicon film. The same results can be obtained as long as the film containing hydrogen is used.

Experiment 3

Here, a W film (100 nm) and a silicon oxide film (100 nm) were laminated on a silicon wafer. Then, heat treatments (at 350° C. for one hour, 400° C. for one hour, 410° C. for one hour, 430° C. for one hour, and 450° C. for one hour) were performed thereto. Further, etching was conducted to the silicon oxide film. The results of the measurement of the stress change for the respective treatments are shown in FIG. 3.

As to the deposition condition of the W film, a tungsten target was used with sputtering, and a film deposition pressure of 0.2 Pa, a film deposition power of 3 kW, and an argon flow rate of 20 sccm were adopted.

Further, as to the deposition condition of the silicon oxide film: an RF type sputtering device was used; a silicon oxide target (with a diameter of 30.5 cm) was used; an argon gas heated for heating a substrate was flown at a flow rate of 30 sccm; and a substrate temperature of 300° C., a film deposition pressure of 0.4 Pa, a film deposition power of 3 kW, and an argon flow rate/oxygen flow rate of 10 sccm/30 sccm were adopted.

Figure 3:
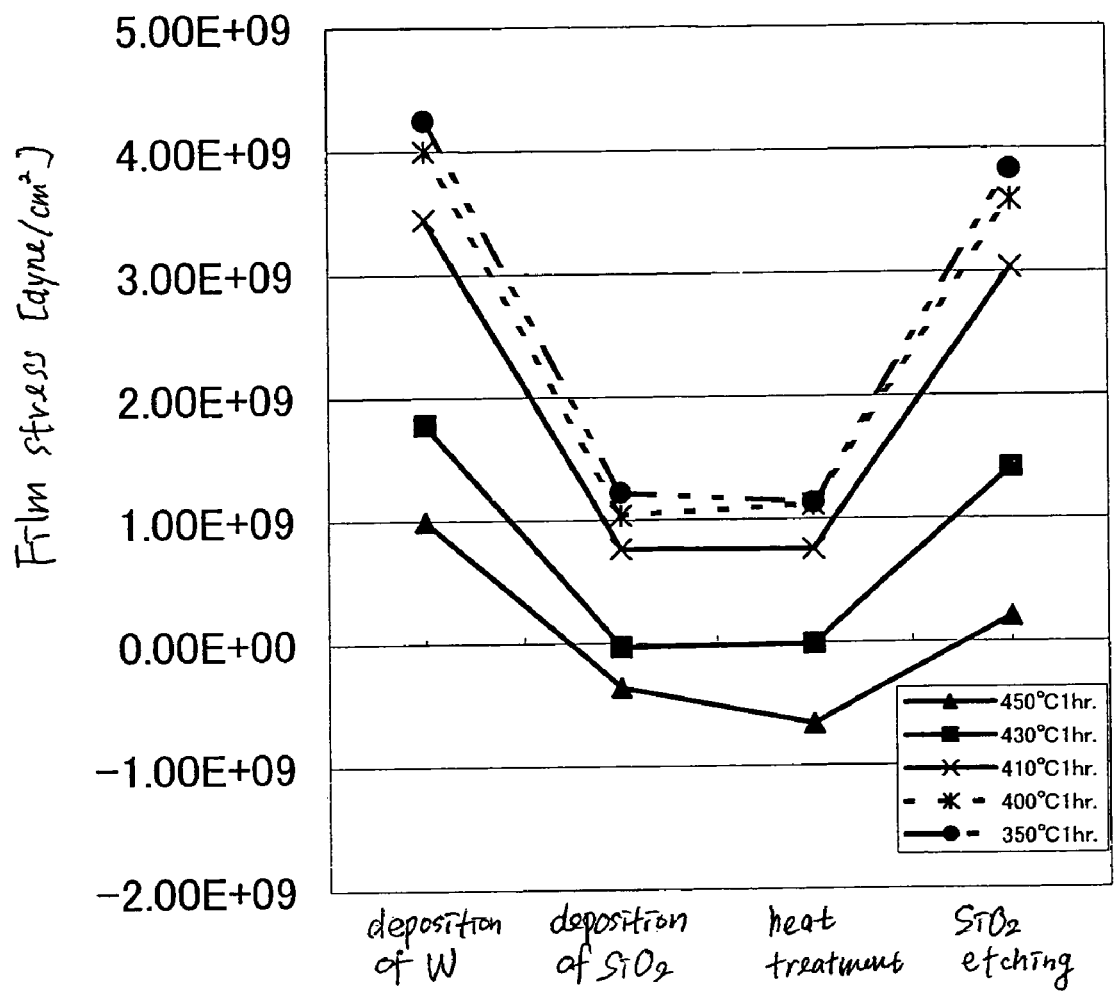
FIG. 3 is a graph showing a stress change in a lamination layer.

From FIG. 3, it is seen that the stress is significantly changed after the deposition of the silicon oxide film and after etching of the silicon oxide film.

Further, for comparison, the measurement of the stress change was performed with regard to a lamination layer in which a W film (100 nm) and a silicon oxide film (20 nm) are formed on a silicon wafer. As a result, the change was hardly seen through the treatments under all the conditions. From this, it is apparent that the stress after the deposition of the silicon oxide film depends on a thickness of the silicon oxide film. Since the stress is greatly changed with a large thickness of the silicon oxide film, distortion is apt to occur at an interface of the W film and the silicon oxide film, which leads to generation of a peeling phenomenon. Therefore, according to the present invention, the thickness of the silicon oxide film and the thickness ratio of the W film and the silicon oxide film are important, and at least the silicon oxide film is made to have a thickness thicker than that of the W film, preferably a thickness equal to or more than twice that of the W film.

Experiment 4

Further, a tungsten film, a silicon oxide film formed by sputtering, a base insulating film, and an amorphous silicon film containing hydrogen formed by PCVD were sequentially laminated on a glass substrate. Heat treatment at 410° C. ore more for diffusing hydrogen was performed to the resultant lamination layer. Then, after the amorphous silicon film is removed by etching, an experiment with a tape was performed thereto. As a result, peeling was recognized. Alternatively, a tungsten film, a silicon oxide film formed by sputtering, and a base insulating film were sequentially laminated on a glass substrate. Heat treatment at 410° C. ore more was performed to the resultant lamination layer. Then, the experiment with the tape was performed thereto. As a result, peeling can not be performed. Therefore, it is considered that the existence of the amorphous silicon film, which is the layer formed on the base film, induces a peeling phenomenon.

From the results of the above experiments, that is, from the fact that, though 410° C. is a border at which whether peeling can be performed or not, the stress change is hardly seen, the inventors of the present invention have found that not only the stress of the lamination film but also the amorphous silicon film and hydrogen contained in the film are related and induce the peeling phenomenon.

Figure 11:
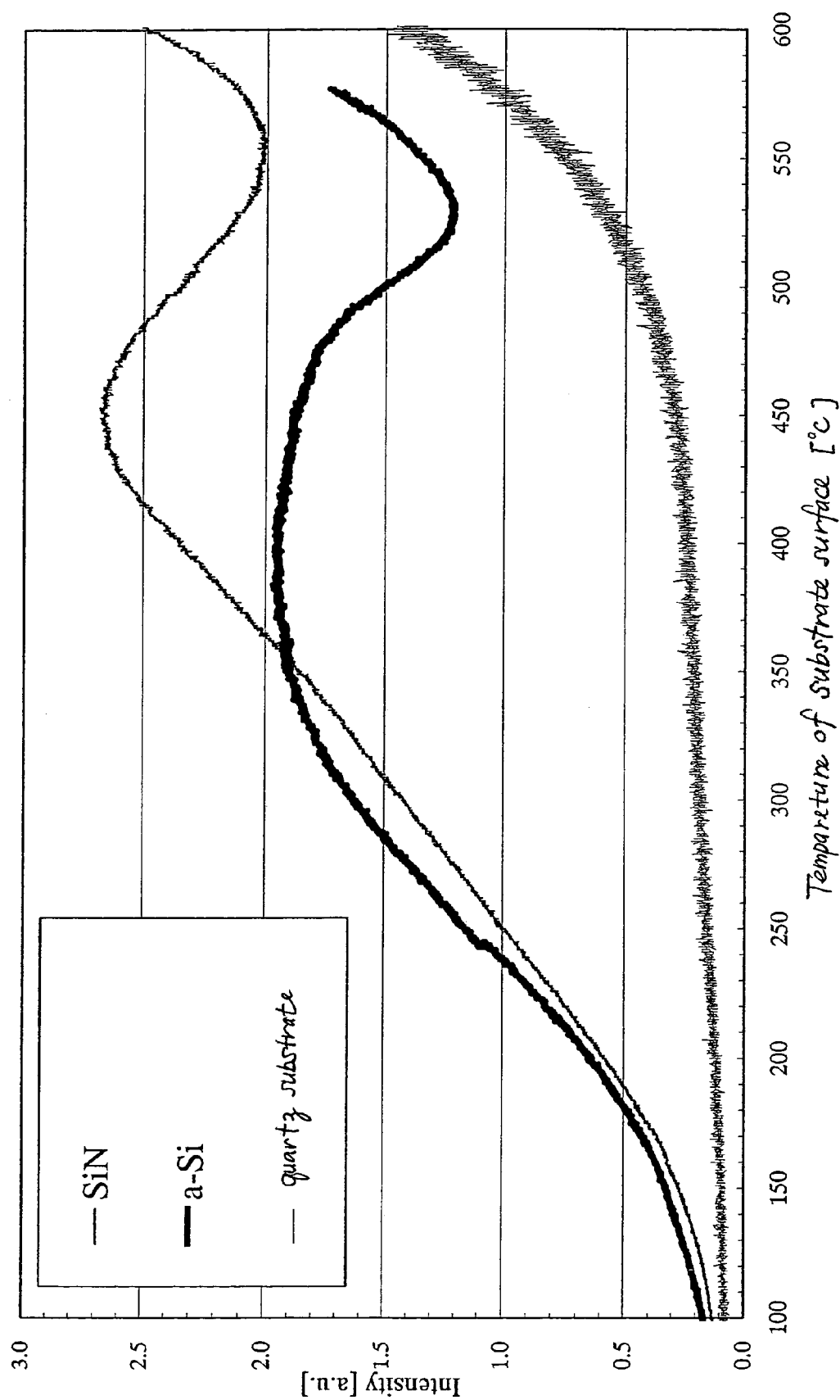
FIG. 11 is a graph showing results of TDS.

Further, FIG. 11 is a graph showing a relationship between a density of hydrogen desorbed from an amorphous silicon film formed on a glass substrate and a substrate-surface temperature (° C.) through temperature-programmed desorption gas analysis (TDS). FIG. 11 indicates that hydrogen desorbed from the amorphous silicon film increases along the rise of the substrate temperature.

Moreover, the inventors of the present invention have found that the thickness ratio of the W film and the silicon oxide film also contributes to the peeling phenomenon. Furthermore, the inventors of the present invention consider that the combination of the material for the metal layer or nitride layer and the material for the oxide layer and the interface state such as adhesion property also lead to the peeling phenomenon.

The present invention that includes the above-described structure will be described in more detail with the following embodiments.

EMBODIMENTS

Embodiment 1

Embodiments of the present invention will be described with FIGS. 4A to 6. Here, a method of simultaneously manufacturing TFTs (n-channel TFTs and a p-channel TFT) for a pixel portion, and for a driving circuit provided in the periphery of the pixel portion on the same substrate will be described in detail using. Although shown here is an example of manufacturing an active matrix substrate to manufacture a reflective liquid crystal display device, there is no limitation putted thereon. If, appropriately change the arrangement of TFTs and the materials of pixel electrodes, needless to say that it is possible to manufacture either a transmissive liquid crystal display device or a light emitting device having a light emitting layer containing an organic compound.

A glass substrate is used as a substrate. First, a silicon oxynitride layer is formed of 50 nm thick on the substrate using a PCVD method.

Subsequently, using sputtering to form a tungsten layer of 50 nm thick as a metal layer, and without being exposed to the atmosphere, using sputtering to continuously form a silicon oxide layer of 200 nm thick as an oxide layer. The silicon oxide layer is formed under conditions as: using sputtering which uses a RF method; using a silicon oxide target (diameter is 30.5); flowing a heated argon gas at a flow rate of 30 sccm for heating the substrate; setting the substrate temperature at 300° C., the pressure of film formation at 0.4 Pa, the electric power at 3 kW, argon flow rate/oxygen flow rate=10 sccm/30 sccm.

Subsequently, removing the tungsten layer placed at periclinal portions or edges of the substrate using $O_2$ ashing.

Subsequently, a silicon oxynitride film formed from $SiH_4$ and $N_2O$ as material gases (composition ratio: Si=32%, 0=59%, N=7%, H=2%) is formed with a thickness of 100 nm and at a film deposition temperature of 300° C. by using plasma CVD to thereby form a lamination. Further, without exposure to an atmosphere, a semiconductor film having an amorphous configuration (in this case, amorphous silicon film) is formed to have a thickness of 54 nm with $SiH_4$ as a film deposition gas and at a film deposition temperature of 300° C. by using plasma CVD. This amorphous silicon film has hydrogen therein, the hydrogen will be diffused by a subsequent heat treatment, and the amorphous silicon film can be peeled by means of physical means in the oxide layer or the interface of the oxide layer.

Then, a nickel acetate salt solution containing nickel of 10 ppm in weight is applied using a spinner. Instead of the application, a method of spraying nickel elements to the entire surface by sputtering may also be used. Then, heat treatment is conducted to perform crystallization, thereby forming a semiconductor film having a crystalline configuration (here, is a polysilicon layer). Here, after the heat treatment (500° C. for 1 hour) for dehydrogenation is conducted, the heat treatment (550° C. for 4 hours) for crystallization is conducted, thereby obtaining a silicon film having a crystalline configuration. Also, the heat treatment (500° C. for 1 hour) for dehydrogenation double functions as heat treatment for diffusing the hydrogen included in the amorphous silicon layer to an interface with the W film and silicon oxide layer. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline configuration is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 470 mJ/cm$^2$. Note that an oxide film is formed on the surface by the first laser light irradiation since the irradiation is conducted in an atmosphere or in an oxygen atmosphere. Though an example of using the pulse laser is shown here, the continuous oscillation laser may also be used. When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator can be given. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 01. to 10 MW/cm$^2$) is required. The semiconductor film is moved at approximately 10 to 2000 cm/s rate relatively corresponding to the laser beams so as to irradiate the semiconductor film.

In addition to the oxide film formed by this laser light irradiation, an oxide film formed by treating the surface with ozone water for 120 seconds together make a barrier layer that has a thickness of 1 to 5 nm in total. Though the barrier layer is formed by using ozone water here, another method such as ultraviolet light irradiation performing in an oxygen atmosphere or oxide plasma treatment to oxidize the surface of the semiconductor film having the crystal structure may be used. In addition, as another method for forming the barrier layer, an oxide film having a thickness of about 1 nm to 10 nm may be deposited by a plasma CVD method, a sputtering method, an evaporation method, or the like. Further, before forming the barrier layer, the oxide film formed by laser light irradiation may be removed.

On the barrier layer, an amorphous silicon film containing argon elements are formed to a thickness of 10 to 400 nm, in this embodiment, 100 nm by sputtering to serve as a gettering site. In this Embodiment, an amorphous silicon film containing argon is formed under an atmosphere containing argon with using a silicon target. When the a plasma CVD method is used for forming an amorphous silicon film containing argon, it is formed under conditions where a flow ratio of monosilane to argon is controlled to be 1/99; a pressure during deposition to be 6.665 Pa (0.05 Torr); a RF power density during deposition to be 0.087 W/cm$^2$; a deposition temperature to be 350° C.

Then, an oven heated at 650° C. is used for heat treatment for 3 minutes for gettering to reduce the nickel concentration in the semiconductor film having a crystal structure. A lamp annealing apparatus may be used instead of the oven.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystal structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Through the above processes, a metal layer 101, an oxide layer 102 and a base insulating film 103 are formed on a substrate 100, after a semiconductor film having a crystal structure was obtained, semiconductor layers 104 to 108 isolated in a island shape are formed by etching processing in the desired shape.

Then, the oxide film is removed with the etchant containing hydrofluoric acid, and at the same time, the surface of the silicon film is cleaned. Thereafter, an insulating film containing silicon as its main constituent, which becomes a gate insulating film 109 is formed. In this embodiment, a silicon oxynitride film (composition ratio: Si=32%, 0=59%, N=7%, H=2%) is formed with a thickness of 115 nm by a plasma CVD method.

Next, as shown in FIG. 4A, on the gate insulating film 109, a first conductive film 110$a$ with a thickness of 20 to 100 nm and a second conductive film 110$b$ with a thickness of 100 to 400 nm are formed in lamination. In this embodiment, a 50 nm thick tantalum nitride film and a 370 nm thick tungsten film are sequentially laminated on the gate insulating film 109.

As a conductive material for forming the first conductive film and the second conductive film, an element selected from the group consisting of Ta, W, Ti, Mo, Al and Cu, or an alloy material or a compound material containing the above element as its main constituent is employed. Further, a semiconductor film typified by a polycrystal silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, resist masks 112 to 117 are formed by a light exposure process as shown in FIG. 4B. Then a first etching treatment is conducted for forming gate electrodes and wires. The first etching treatment employs first and second etching conditions. ICP (inductively coupled plasma) etching is preferred for the etching. The films can be etched to have desired taper shapes by using ICP etching and suitably adjusting the etching conditions (the amount of power applied to a coiled electrode, the amount of power applied to an electrode on the substrate side, the temperature of the electrode on the substrate side, etc.). For etching gas, a suitable one can be chosen from chlorine-based gas, typically, Cl$_2$, BCl$_3$, SiCl$_4$, or CCl$_4$, fluorine-based gas, typically, CF$_4$, SF$_6$, or NF$_3$, and O$_2$.

In this embodiment, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc formed coil is described here) is 25 cm diameter disc. The W film is etched so as to make end portions of the first conductive layer in taper shape in the first etching conditions. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remained residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15° to 45°.

Thus, first shape conductive layers 119 to 123 composed of the first conductive layer and the second conductive layer (first conductive layers 119a to 123a and second conductive layers 119b to 123b) are formed by the first etching process. The insulating film 109 that becomes the gate insulating film is etched by approximately 10 to 20 nm, and becomes a gate insulating film 118 in which regions which are not covered by the first shape conductive layers 119 to 123 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ration of W to SiON is 6.83. In the case where $SF_6$ is used as the etching gas, the selection ratio with respect to the insulating film 118 is high as described above. Thus, reduction in the film thickness can be suppressed. In this embodiment, the film thickness of the insulating film 118 is reduced by only about 8 nm.

By the second etching process, the taper angle of W becomes 70°. By the second etching process, second conductive layers 126b to 131b are formed. On the other hand, the first conductive layers are hardly etched to become first conductive layers 126a to 131. Note that the first conductive layers 126a to 131a have substantially the same size as the first conductive layers 119a to 124a. In actuality, the width of the first conductive layer may be reduced by approximately 0.3 μm, namely, approximately 0.6 μm in the total line width in comparison with before the second etching process. There is almost no change in size of the taper of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as raw material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rage of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 4D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 126 to 130 become masks against the impurity element imparting n-type conductivity, and first impurity regions 132 to 136 are formed in a self-aligning manner. The impurity element imparting n-type conductivity is added to the first impurity regions 132 to 136 in a concentration range of $1 \times 10^{16}$ to $1 \times 10^{17}$/cm$^3$. Here, the region having the same concentration range as the first impurity region is also called an n$^-$ region.

Note that although the first doping process is performed after the removal of the masks made of resist in this embodiment, the first doping process may be performed without removing the masks made of resist.

Figure 5A:
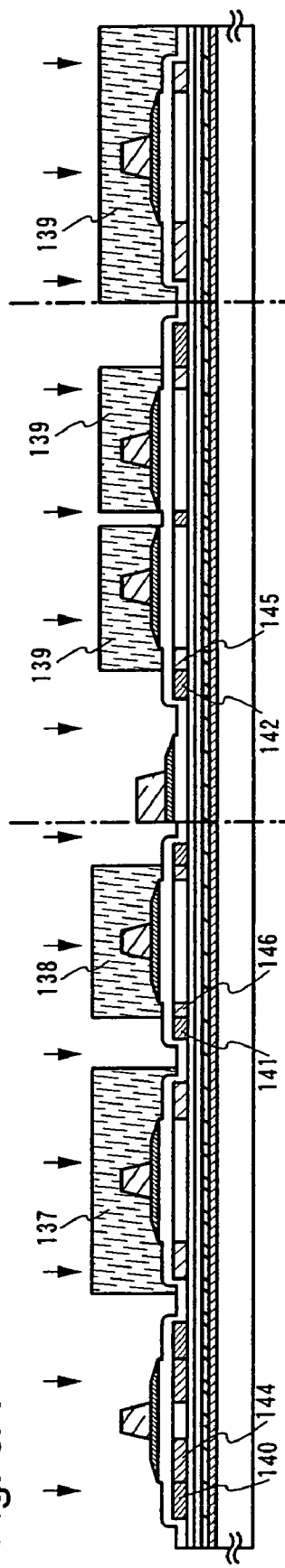
FIGS. 5A to 5C are views showing steps of manufacturing the active matrix substrate (Embodiment 1)

Subsequently, as shown in FIG. 5A, masks 137 to 139 made of resist are formed, and a second doping process is conducted. The mask 137 is a mask for protecting a channel forming region and a periphery thereof of a semiconductor layer forming a p-channel TFT of a driving circuit, the mask 138 is a mask for protecting a channel forming region and a periphery thereof of a semiconductor layer forming one of n-channel TFTs of the driving circuit, and the mask 139 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 126b to 128b as masks. Of course, phosphorous is not added to the regions covered by the masks 137 to 139. Thus, second impurity regions 140 to 142 and a third impurity region 144 are formed. The impurity element imparting n-type conductivity is added to the second impurity regions 140 to 142 in a concentration range of $1 \times 10^{20}$ to $1 \times 10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1\times10^{18}$ to $1\times10^{19}/cm^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n⁻ region. Furthermore, the regions covered by the masks 138 and 139 are not added with the impurity element in the second doping process, and become first impurity regions 146 and 147.

Figure 5B:
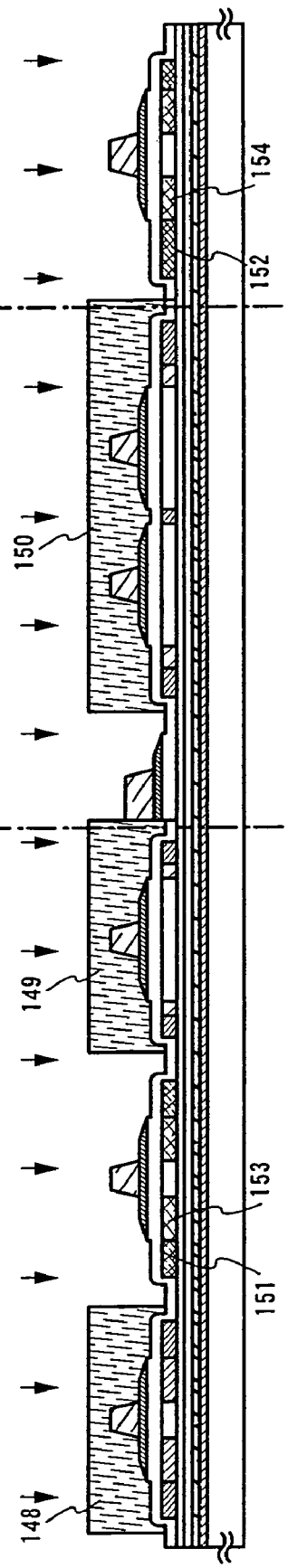
Figure 5C:
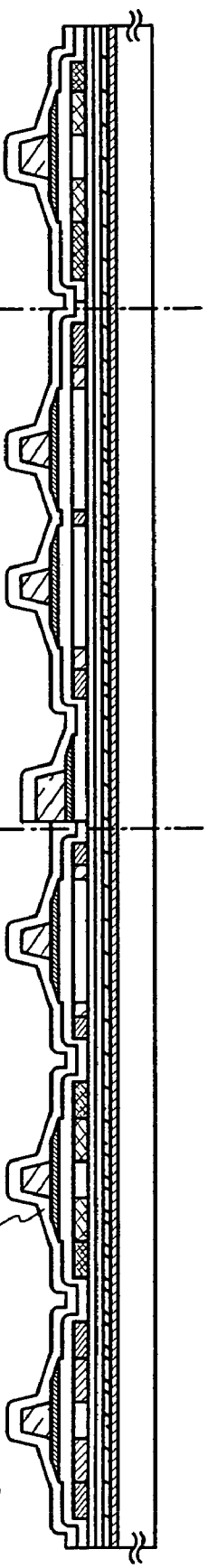

Next, after the masks 137 to 139 made of resist are removed, masks 148 to 150 made of resist are newly formed, and a third doping process is conducted as shown in FIG. 5B.

In the driving circuit, by the third doping process as described above, fourth impurity regions 151, 152 and fifth impurity regions 153, 154 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 151 and 152 in a concentration range of $1\times10^{20}$ to $1\times10^{21}/cm^3$. Note that, in the fourth impurity regions 151, 152, phosphorous (P) has been added in the preceding step (n⁻ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p⁺ region.

Further, fifth impurity regions 153 and 154 are formed in regions overlapping the tapered portion of the second conductive layer 127a, and are added with the impurity element imparting p-type conductivity in a concentration range of $1\times10^{18}$ to $1\times10^{20}/cm^3$. Here, the region having the same concentration range as the fifth impurity region is also called a p⁻ region.

Through the above-described steps, the impurity regions having n-type or p-type conductivity are formed in the respective semiconductor layers. The conductive layers 126 to 129 become gate electrodes of a TFT. Further, the conductive layer 130 becomes one of electrodes, which forms the storage capacitor in the pixel portion. Moreover, the conductive layer 131 forms a source wiring in the pixel portion.

Next, an insulating film (not shown) that covers substantially the entire surface is formed. In this embodiment, a 50 nm thick silicon oxide film is formed by a plasma CVD method. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or an excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 155 is formed of a silicon nitride film, and heat treatment (300 to 550° C. for 1 to 12 hours) is performed, thereby conducting a step of hydrogenating the semiconductor layers. (FIG. 5C) This step is a step of terminating dangling adheres of the semiconductor layers by hydrogen contained in the first interlayer insulating film 155. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heat treatment condition that the second conductive layer can withstand in the step of hydrogenation. As another means for hydrogenation, a plasma hydrogenation (using hydrogen excited by plasma) may be conducted.

Next, a second interlayer insulating film 156 is formed from an organic insulating material on the first interlayer insulating film 155. In this embodiment, an acrylic resin film with a thickness of 1.6 µm is formed. Then, a contact hole that reaches the source wiring 131, contact holes that respectively reach the conductive layers 129 and 130, and contact holes that reach the respective impurity regions are formed. In this embodiment, a plurality of etching processes is sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrodes are formed by using Al, Ti, Mo, W and the like. As the material of the electrodes and pixel electrodes, it is desirable to use a material excellent in reflecting property, such as a film containing Al or Ag as its main constituent or a lamination film of the above film. Thus, source electrodes or drain electrodes 157 to 162, a gate wiring 164, a connection wiring 163, and a pixel electrode 165 are formed.

Figure 6:
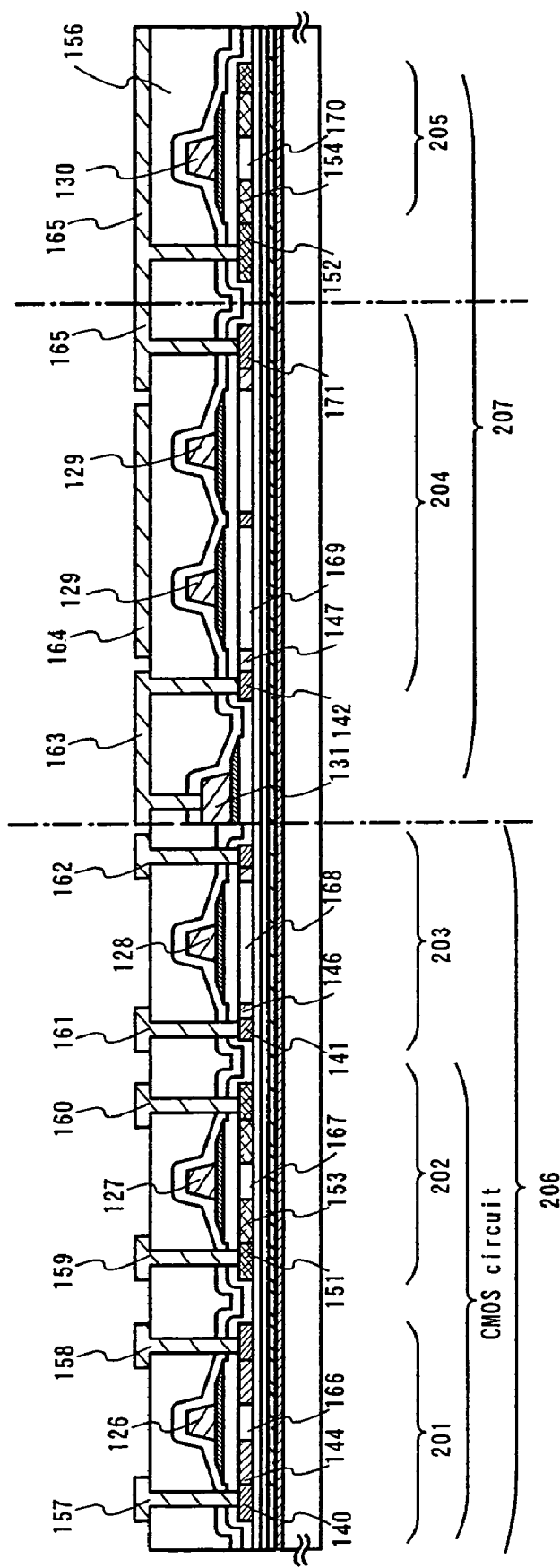
FIG. 6 is a view showing a step of manufacturing the active matrix substrate (Embodiment 1)

As described above, a driving circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate (FIG. 6). In this specification, the above substrate is called an active matrix substrate for the sake of convenience.

In the pixel portion 207, the pixel TFT 204 (n-channel TFT) has a channel forming region 169, the first impurity region (n⁻ region) 147 formed outside the conductive layer 129 forming the gate electrode, and the second impurity regions (n⁺ region) 142, 171 functioning as a source region. Further, in the semiconductor layer functioning as one of the electrodes of the storage capacitor 205, the fourth impurity region 152 and the fifth impurity region 154 are formed. The storage capacitor 205 is constituted of the second electrode 130 and the semiconductor layers 152, 154, and 170 with the insulating film (the same film as the gate insulating film) 118 as dielectric.

Further, in the driving circuit 206, the n-channel TFT 201 (first n-channel TFT) has a channel forming region 166, the third impurity region (n⁻ region) 144 that overlaps a part of the conductive layer 126 forming the gate electrode through the insulating film, and the second impurity region (n⁺ region) 140 functioning as a source region or a drain region.

Further, in the driving circuit 206, the p-channel TFT 202 has a channel forming region 167, the fifth impurity region (p⁻ region) 153 that overlaps a part of the conductive layer 127 forming the gate electrode through the insulating film, and the fourth impurity region (p⁺ region) 151 functioning as a source region or a drain region.

Furthermore, in the driving circuit 206, the n-channel TFT 203 (second n-channel TFT) has a channel forming region 168, the first impurity region (n⁻ region) 146 outside the conductive layer 128 forming the gate electrode, and the second impurity region (n⁺ region) 141 functioning as a source region or a drain region.

The above TFTs 201 to 203 are appropriately combined to form a shift register circuit, a buffer circuit, a level shifter circuit, a latch circuit and the like, thereby forming the driving circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved f-characteristics and to have sufficient reliability.

Further, even in the TFTs of the pixel portion 207, using the second laser irradiation, reduction of OFF current and variation can be realized.

Further, an example of fabricating the active matrix substrate for forming a reflective display device is shown in this embodiment. However, if the pixel electrode is formed of a transparent conductive film, a transmission type display device can be formed although the number of photomasks is increased by one.

Still further, this embodiment uses including but not limited to a glass substrate, a quartz substrate, a semiconductor substrate, and a ceramics substrate. A metal substrate also may be used therefor.

Moreover, after the state of FIG. 6 was obtained, if the layer (layer to be peeled) containing a TFT provided on the oxide layer 102 has a sufficient mechanical strength, the substrate 100 may be pulled away. In the present Embodiment, since the mechanical strength of the layer to be peeled is not sufficient, it is preferred that after the supporting body (not shown) for fixing the layer to be peeled was pasted, it is peeled.

Embodiment 2

Embodiment 1 shows an example of a reflective display device in which a pixel electrode is formed from a reflective metal material. Shown in this embodiment is an example of transmissive display device in which a pixel electrode is formed from a light-transmitting conductive film.

The fabricate processes up through the step of forming an interlayer insulating film are identical with the processes of Embodiment 1, and the description thereof is omitted here.

After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 7:
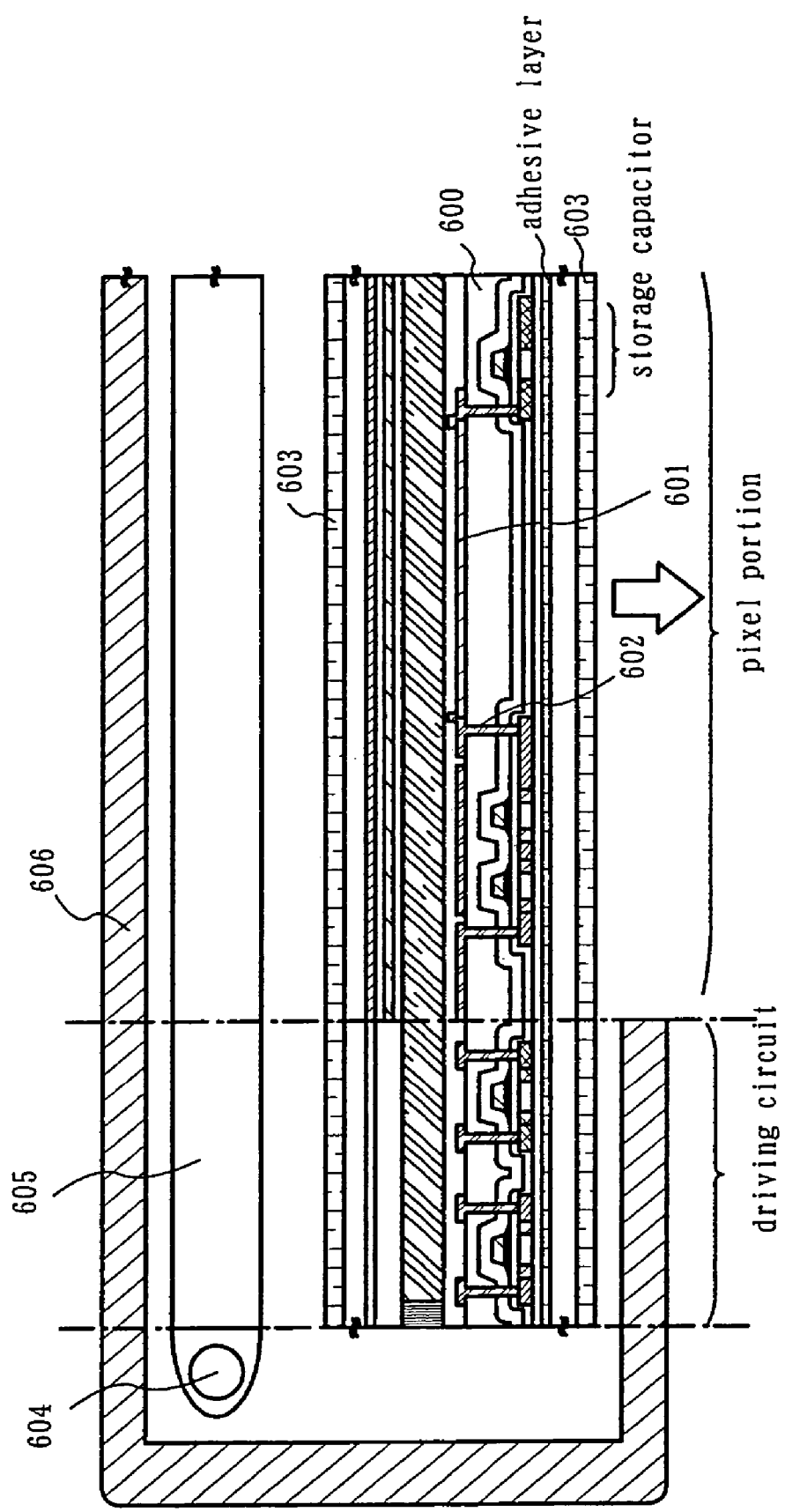
FIG. 7 is a sectional view of a liquid crystal display device (Embodiment 2)

An active matrix substrate is completed as above. A liquid crystal module is fabricated using this active matrix substrate adhered with a plastic substrate upon peeling the substrate. The liquid crystal module is provided with a backlight 604 and a light guiding plate 605, and is covered with a cover 606 to complete the active matrix type liquid crystal display device of which a partial sectional view is shown in FIG. 7. The cover is adhered to the liquid crystal module using an adhesive or an organic resin. When adhering the plastic substrate to the opposite substrate, the substrates may be framed so that the space between the frame and the substrates is filled with an organic resin for adhering. Since the display device is of transmissive type, the active matrix substrate and the opposite substrate each needs a polarizing plate 603 to be adhered.

Embodiment 3

An example for fabricating a light emitting device that has a light emitting element including an organic compound layer as a light emitting layer, which formed on a plastic substrate will be described in this embodiment with reference to FIG. 8.

FIG. 8A is a top surface view of a light emitting device and FIG. 8B is a cross-sectional view of FIG. 8A taken along the line A-A'. A dotted line 1101 is a source signal line driving circuit, 1102 is a pixel portion, and 1103 is a gate signal line driving circuit. Reference numeral 1104 is an enclosing substrate and 1105 is a sealing agent. Inside enclosed by the first sealing agent 1105 is filled with a second transparent sealant 1107. The second sealant 1107 is exposed at four corners.

Reference numeral 1108 is a source signal line driving circuit and a wiring for transmitting signals inputted to the gate signal line driving circuit 1103, and receives a video signal and a clock signal from FPC 1109 as an external input terminal. Though only FPC is shown here, a print wiring board (PWB) may be attached to the FPC. A light emitting device in this specification includes not only a light emitting device body but also a light emitting device to which FPC or PWB are attached.

Next, the cross sectional structure will be explained with reference to FIG. 8B. A driving circuit and a pixel portion are formed on the substrate 1110. Here, the source signal driving circuit 1101 as a driving circuit and the pixel portion 1102 are formed. In addition, by using a peeling method described in Embodiment mode 1 and Embodiment 1, the substrate 1110 is adhered with a base film by an adhesive layer 1100.

CMOS circuit is formed as a source signal line driver circuit 1101 by combining an n-channel TFT 1123 and a p-channel TFT 1124. The TFT forming a driving circuit may be formed of known CMOS circuit, PMOS circuit, or NMOS circuit. This embodiment shows a built-in driver that a driving circuit is formed on a substrate, but not limited thereto. The driving circuit can be formed not on the substrate but at exterior portion thereof. In addition, shown in here is an example in which two TFTs is used for one pixel, but three TFTs or more may be appropriately used for one pixel.

The pixel portion 1102 is composed of a plurality of pixels including a switching TFT 1111, a current control TFT 1112, and a first electrode (anode) 1113 connected electrically to a drain the current control TFT 1112.

Since a first electrode 1113 contacts directly to a drain of the TFT, the bottom layer of the first electrode 1113 is formed of a material that is made from silicon that can be an ohmic contact to the drain. The surface of the first electrode 1113 that contacts to an organic compound layer is preferable to be made from a material that has the large work function. When the first electrode is formed of three-laminated structure, for example, a titanium nitride film, an aluminum-based film, and a titanium nitride film, the first electrode can suppress resistance as a wiring low, be a good ohmic contact to the drain, and function as an anode. In addition, the first electrode 1113 can be formed either of a single layer of a titanium nitride film or a laminated structure of three or more layers.

Further, an insulator (referred to as a bank, a barrier, or the like) 1114 is formed on both ends of the first electrode (anode) 1113. The insulator 1114 may be made from an organic resin film or an insulating film containing silicon. Here, a positive photosensitive acrylic resin film is used for forming the insulator 1114 as shown in FIG. 8.

In order to attain a good coverage, it is preferable to curve an upper edge portion or a lower edge portion of an insulating material 1114 to give a radius of curvature. If positive photosensitive acrylic is used as a material of the insulating material 1114, for example, it is preferable to curve only an upper edge portion of the insulating material to give a radius of curvature (preferably, 0.2 to 3 µm). A negative photosensitive material which becomes insoluble in an etchant under light and a positive photosensitive material which becomes soluble in an etchant under light both can be used for the insulating material 1114.

The insulator 1114 may be covered with a protective film made from an aluminum nitride film, an aluminum oxynitride film, or silicon nitride film. The protective film is an insulating film that is made from silicon nitride or silicon oxynitride as major components by DC sputtering or RF sputtering, or a thin film that is made from carbon as major components. When a silicon target is used for forming the protective film in an atmosphere containing nitride and argon, a silicon nitride film can be formed. Or a silicon nitride target can also be used. The protective film can be formed by using a deposition device using remote plasma. It is preferable that the thickness of the protective film is formed to be thin as much as possible in order for light to pass therethrough.

An organic compound layer 1115 is selectively formed by evaporation using evaporation mask or ink-jet on the first electrode (anode) 1113. A second electrode (cathode) 1116 is formed on the organic compound layer 1115. Consequently, the first electrode (anode) 1113, an organic compound film 1115, and a light emitting element 1118 formed of the second electrode (cathode) 1116. Since an example that the light emitting element emits white light is shown here, a color filter formed of a coloring layer 1131 and BM 1132 (for ease of illustration, an over coat layer is not shown) is provided.

If organic compound layers that can achieve R, G, B luminescence are formed respectively, full color display can be realized without color filter.

In order for the light emitting element 1118 on the substrate 1110 to be encapsulated, an enclosing substrate 1104 is adhered using a first sealant 1105 and a second sealant 1107. Preferred material for the first sealant 1105 and the second sealant 1107 is epoxy resin. It is preferable that the first sealant 1105 and the second sealant 1107 do not penetrate moisture or oxygen as much as possible.

In this embodiment, for the enclosing substrate 1104, a plastic substrate made from FRP (Fiberglass-Reinforced Plastics), PVF (polyvinylfluoride), Mylar, polyester, acrylic, or the like can be used besides a glass substrate or a quarts substrate. After the enclosing substrate is adhered using the first sealant 1105 and the second sealant 1107, third sealant can be used for adhering the enclosing substrate 1104 to cover the side faces (exposed faces).

Encapsulation of the light emitting element 1118 using the first sealant 1105 and the second sealant 1107 can cut it off absolutely from the outside and prevent moisture or oxygen that cause deterioration of an organic compound layer from penetrating. Therefore the high reliable light emitting device can be fabricated.

If a transparent conductive film is used as the first electrode 1113, both top and bottom emitting structure light emitting devices can be fabricated.

Although shown in this embodiment is an example of a structure hereafter called a top emission structure in which: a layer containing an organic compound is formed on an anode, and a cathode functioning as a transparent electrode is formed on the layer containing an organic compound, but a structure that has a light emitting element in which: an organic compound layer is formed on an anode; and a cathode is formed on the organic compound layer, and light generated in the organic compound layer is emitted through the anode formed as a transparent electrode to a TFT (hereafter, the structure is referred to as a bottom emission) also can be applied.

This embodiment can be freely combined with any of Embodiment mode, or Embodiment 1.

Embodiment 4

By implementing the invention enables to complete of various module (active matrix type liquid crystal module, active matrix type EL module and active matrix type EC module). That is to say, by implementing the invention, all electronic apparatuses incorporated with those devices are completed.

Figure 9A:
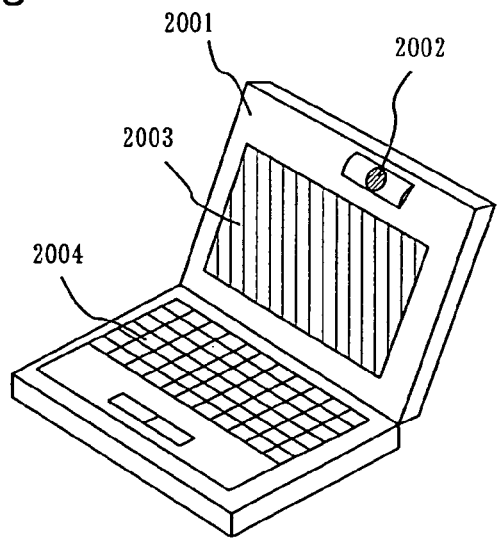
FIGS. 9A to 9E are diagrams of examples of electronic devices (Embodiment 4)

As such electronic apparatuses, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 9A and 10C show examples of these.

FIG. 9A is a personal computer which includes a main body 2001, an image input portion 2002, a display portion 2003 and a keyboard 2004.

Figure 9B:
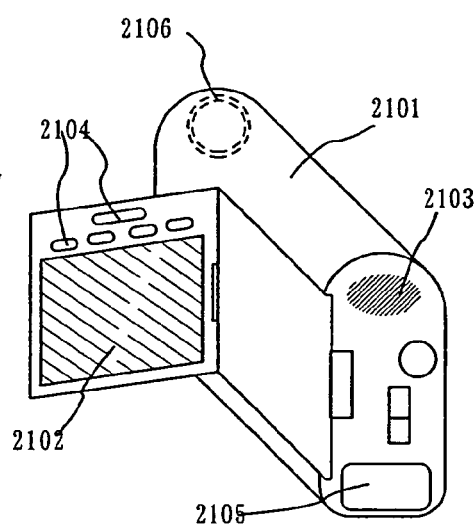

FIG. 9B is a video camera which includes a main body 2101, a display portion 2102, a voice input portion 2103, an operation switch 2104, a battery 2105, an image receiving portion 2106.

Figure 9C:
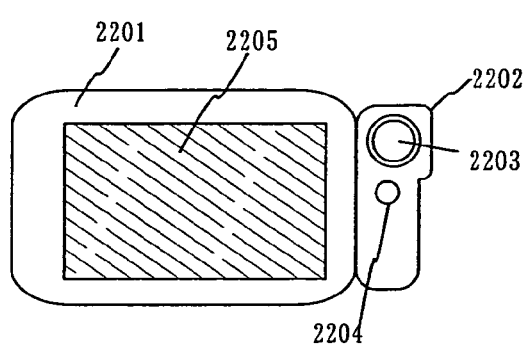

FIG. 9C is a mobile computer which includes a main body 2201, a camera portion 2202, an image receiving portion 2203, an operation switch 2204 and a display portion 2205.

Figure 9D:
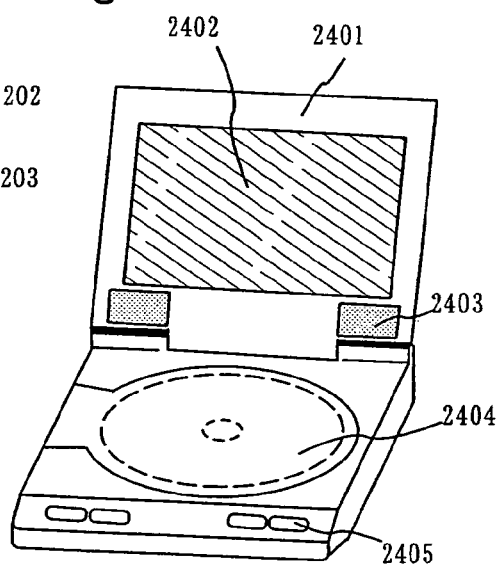

FIG. 9D is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or Internet.

Figure 9E:
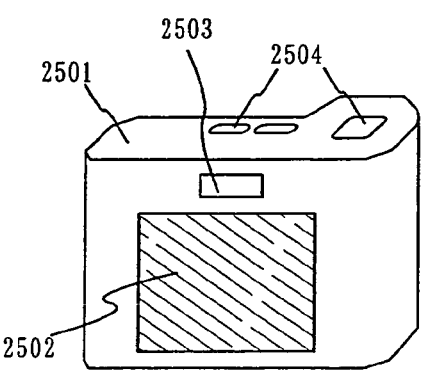

FIG. 9E is a digital camera which includes a main body 2501, a display portion 2502, an eye-piece portion 2503, an operation switch 2504 and an image receiving portion (not illustrated).

Figure 10A:
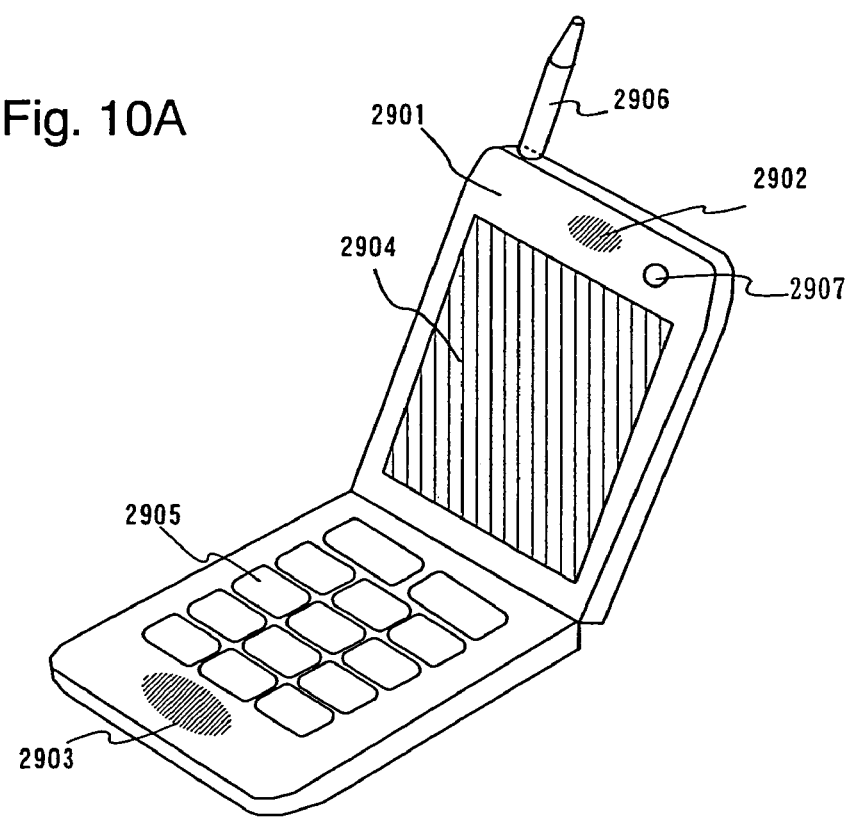
FIGS. 10A to 10C are diagrams of examples of electronic devices (Embodiment 4)

FIG. 10A is a portable telephone which includes a main body 2901, a voice output portion 2902, a voice input portion 2903, a display portion 2904, an operation switch 2905, an antenna 2906 and an image input portion (CCD, image sensor) 2907.

Figure 10B:
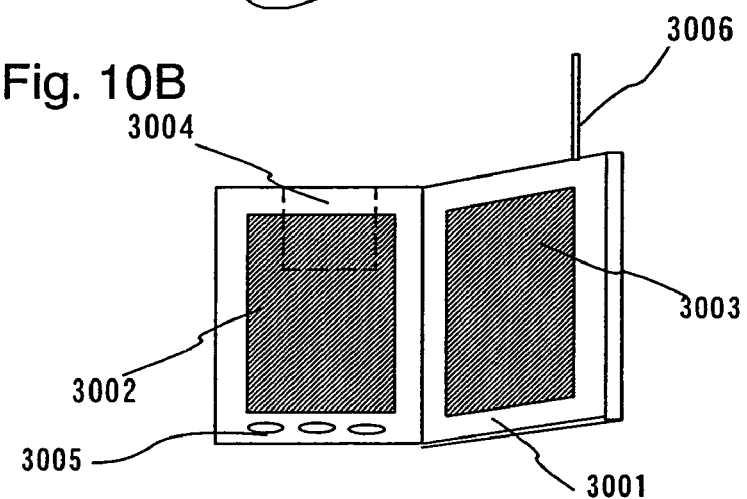
Figure 10C:
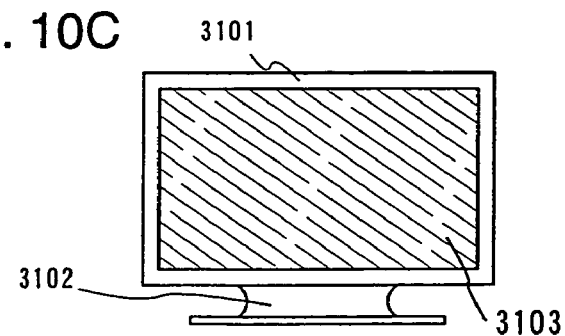

FIG. 10B is a portable book (electronic book) which includes a main body 3001, display portions 3002, 3003, a record medium 3004, an operation switch 3005, and an antenna 3006.

FIG. 10C is the display which includes a main body 3101, a support base 3102 and a display portion 3103.

Incidentally, the display shown in FIG. 10C is of a screen size of middle or small type or large type, for example, a screen size of 5 to 20 inches. Further, in order to form the display portion of this size, it is preferable to use a display portion having a side of a substrate of 1 m and carry out mass production by taking many faces. As described above, the range of applying the present invention is extremely wide and is applicable to a method of fabricating electronic apparatuses of all fields. Further, the electronic apparatuses of the embodiment can be realized by any combination of Embodiment Mode and Embodiments 1 to 3.

According to the present invention, peeling from the substrate is performed by the physical means. Therefore, there is no damage caused to the semiconductor layer, and reliability of the element can be improved.

Further, according to the present invention, it is possible to perform not only peeling of the layer to be peeled having a small area but also peeling of the whole layer to be peeled having a large area at a high yield.

In addition, according the present invention, peeling can be easily performed by the physical means, for example, by hand. Therefore, it can be said that the process appropriate for mass production is attained. Further, in the case of manufacturing the manufacturing device for peeling the layer to be peeled for mass production, a large-scale manufacturing device can also be manufactured at low cost.

What is claimed is:

1. A method of manufacturing a semiconductor device comprising:
   forming a nitride layer over a substrate;
   forming an oxide layer contacting with the nitride layer;
   forming an insulating film contacting with the oxide layer;
   forming a semiconductor film having an amorphous structure over the insulating film, wherein the semiconductor film comprises hydrogen;
   performing heat treatment for diffusing the hydrogen;
   adhering a support member to a layer to be peeled, wherein the layer comprises the insulating film and the semiconductor film; and
   peeling the layer to be peeled from the nitride layer formed over the substrate after adhering the support member.

2. A method of manufacturing a semiconductor device comprising:
   forming a nitride layer over a substrate;
   forming an oxide layer contacting with the nitride layer;
   forming an insulating film contacting with the oxide layer;
   forming a semiconductor film having an amorphous structure over the insulating film, wherein the semiconductor film comprises hydrogen;
   performing heat treatment for diffusing the hydrogen;
   forming a thin film transistor comprising the semiconductor film as an active layer and an element connected with the thin film transistor;
   adhering a support member to a layer to be peeled, wherein the layer comprises the insulating film, the thin film transistor and the element connected with the thin film transistor; and
   peeling the layer to be peeled from the nitride layer formed over the substrate after adhering the support member.

3. A method of manufacturing a semiconductor device according to claim 1, wherein the heat treatment is performed at a temperature equal to or higher than a temperature at which the hydrogen in the semiconductor film is emitted or diffused.

4. A method of manufacturing a semiconductor device according to claim 2, wherein the heat treatment is performed at a temperature equal to or higher than a temperature at which the hydrogen in the semiconductor film is emitted or diffused.

5. A method of manufacturing a semiconductor device according to claim 1, wherein the nitride layer comprises titanium nitride, tungsten nitride, tantalum nitride, or molybdenum nitride.

6. A method of manufacturing a semiconductor device according to claim 2, wherein the nitride layer comprises titanium nitride, tungsten nitride, tantalum nitride, or molybdenum nitride.

7. A method of manufacturing a semiconductor device according to claim 1, wherein the oxide layer is a silicon oxide film formed by sputtering.

8. A method of manufacturing a semiconductor device according to claim 2, wherein the oxide layer is a silicon oxide film formed by sputtering.

9. A method of manufacturing a semiconductor device according to claim 1, wherein the insulating film is at least one selected from the group consisting of a silicon oxide film, a silicon oxynitride film, and a lamination layer of the films.

10. A method of manufacturing a semiconductor device according to claim 2, wherein the insulating film is a silicon oxide film, a silicon oxynitride film, or a lamination layer of the films.

11. A method of manufacturing a semiconductor device according to claim 1, wherein a thickness of the oxide layer is thicker than a film thickness of the nitride layer.

12. A method of manufacturing a semiconductor device according to claim 2, wherein a thickness of the oxide layer is thicker than a film thickness of the nitride layer.

13. A method of manufacturing a semiconductor device according to claim 2, wherein an element provided on the insulating film is at least one selected from the group consisting of a light emitting element, a semiconductor element, and a liquid crystal element.

14. A method of manufacturing a semiconductor device comprising:
   forming a nitride layer over a substrate;
   forming an oxide layer on the nitride layer;
   forming an insulating layer on the oxide layer by plasma CVD;

forming a semiconductor film comprising amorphous silicon and hydrogen over the insulating layer;

crystallizing the semiconductor film;

patterning the crystallized semiconductor film to form at least one island-like semiconductor layer;

forming at least one thin film transistor using the at least one semiconductor layer for a channel forming region thereof; and separating the substrate from the at least one thin film transistor.

15. A method of manufacturing a semiconductor device according to claim 14, wherein the nitride layer comprises titanium nitride, tungsten nitride, tantalum nitride, or molybdenum nitride.

16. A method of manufacturing a semiconductor device according to claim 14, wherein the oxide layer comprises a material selected from the group consisting of silicon oxide, silicon nitride oxide and a metal oxide.

17. A method of manufacturing a semiconductor device according to claim 14, wherein the oxide layer is formed by sputtering.

18. A method of manufacturing a semiconductor device according to claim 14, wherein a surface of the nitride layer is oxidized during the formation of the oxide layer.

19. A method of manufacturing a semiconductor device comprising:

forming a nitride layer over a substrate;

forming an oxide layer on the nitride layer;

forming a layer containing hydrogen over the oxide layer;

heating the layer containing hydrogen to emit hydrogen therefrom; and separating the substrate from the layer containing hydrogen after the heating.

20. A method of manufacturing a semiconductor device according to claim 19, wherein the heating of the layer containing hydrogen is performed at a temperature of 410° C. or higher.

21. A method of manufacturing a semiconductor device according to claim 19, wherein the nitride layer comprises titanium nitride, tungsten nitride, tantalum nitride, or molybdenum nitride.

22. A method of manufacturing a semiconductor device according to claim 19, wherein the oxide layer comprises a material selected from the group consisting of silicon oxide, silicon nitride oxide and a metal oxide.

23. A method of manufacturing a semiconductor device according to claim 19, wherein the oxide layer is formed by sputtering.

24. A method of manufacturing a semiconductor device according to claim 19, wherein a surface of the nitride layer is oxidized during the formation of the oxide layer.

25. A method of manufacturing a semiconductor device according to claim 19, wherein the layer containing hydrogen comprises silicon nitride.

26. A method of manufacturing a semiconductor device according to claim 1, wherein the peeling of the layer to be peeled is performed by physical means.

27. A method of manufacturing a semiconductor device according to claim 2, wherein the peeling of the layer to be peeled is performed by physical means.

* * * * *